United States Patent [19]

Lin

[11] Patent Number: 5,502,009
[45] Date of Patent: Mar. 26, 1996

[54] METHOD FOR FABRICATING GATE OXIDE LAYERS OF DIFFERENT THICKNESSES

[75] Inventor: Jengping Lin, Taoyuan Hsien, Taiwan

[73] Assignee: United Microelectronics Corp., Hsinchu, Taiwan

[21] Appl. No.: 389,247

[22] Filed: Feb. 16, 1995

[51] Int. Cl.⁶ .................................................. H01L 21/02
[52] U.S. Cl. .......................... 437/239; 437/979; 437/983; 437/56
[58] Field of Search ...................... 437/983, 979, 437/56, 57, 58, 45, 239; 148/DIG. 117

[56] References Cited

U.S. PATENT DOCUMENTS 4,859,619  8/1989  Wu et al. .................................. 437/45
5,254,489  10/1993  Nakata ...................................... 437/40

Primary Examiner—George Fourson
Assistant Examiner—Brian K. Dutton
Attorney, Agent, or Firm—Ladas & Parry

[57] ABSTRACT

A method for fabricating gate oxide layers of different thicknesses on a silicon substrate. A field oxide layer is formed on a predetermined portion of the silicon substrate to define first active regions and second active regions. A first gate oxide layer is formed over the first and second active regions. A barrier layer is formed to cover a portion of the first gate oxide layer within the first active regions. The portion of the first gate oxide layer within the second active regions is then removed utilizing the barrier layer as masking. A second gate oxide layer is then formed over the second active regions.

15 Claims, 6 Drawing Sheets

METHOD FOR FABRICATING GATE OXIDE LAYERS OF DIFFERENT THICKNESSES

BACKGROUND OF THE INVENTION

1. Field of the Invention

The invention generally relates to a manufacturing process for integrated circuits, and more particularly, relates to a method for fabricating MOS (metal-oxide-semiconductor) devices having gate oxide layers of different thicknesses for diverse uses.

2. Description of the Related Art

As the size of integrated circuit devices, especially their channel lengths, are scaled down to the range of sub-half micro dimensions, the gate oxide layer of MOS devices will approach the thickness range of several tens of Angstroms. 3.3 V or even smaller supply voltages will be gradually accepted where high density VLSI circuits are required, since there are reliability issues when operating a sub-half micro MOSFET at 5 V. However, although such a 3.3 V operating voltage is compatible with the sub-half micro device for its core circuit to ensure good device reliability, there is still a need for a 5 V supply voltage to provide compatibility with other systems. For example, MOS devices used in periphery circuits, such as power-down circuits and a portion of I/O protection circuits, are typically operated at 5 V supply voltage. These MOS devices are provided with a longer channel length and a thicker gate oxide layer than that used in the core circuit because of operational speed requirements. Therefore, employing these type of combined VLSI circuits necessitates a technique for fabricating gate oxide layers of different thicknesses for diverse uses within the same silicon substrate. In addition, the fabrication technique to produce gate oxide layers with different thicknesses would be applicable to devices which require two different threshold voltages, such as read only memory (ROM) devices.

A conventional method for fabricating gate oxide layers of different thicknesses is depicted in FIGS. 1A–1D, which illustrate the process flow in cross-sectional views. First referring to FIG. 1A, there is shown monocrystalline silicon substrate 1. While field oxide layer 10 is formed on the predetermined region of silicon substrate 1 to define a plurality of first active regions and second active regions therebetween, FIG. 1A shows just two active regions, namely first active region 11 and second active region 12, respectively. A thermal oxidation process is applied to the surface of first active region 11 and second active region 12 to form oxide layer 13 thereon. This oxidation process is performed within the temperature range of 750°–1000° C. for 10 minutes to 2 hours.

By photolithography technique, photoresist layer 100 is formed onto a portion of oxide layer 13 to shield second active region 12. The portion of oxide layer 13 within first active region 11 is then etched by hydrofluoric acid using the photoresist layer as masking to remove the portion of oxide layer 13 in active region 11, as depicted in FIG. 1B. After removing the photoresist layer with sulfuric acid, silicon substrate 1 is subjected to a thermal oxidation process to grow first gate oxide layer 14 over first active region 11 and second gate oxide layer 15 over the second active region, respectively. In particular, second gate oxide layer 15 is formed by incorporating the portion of oxide layer 13 of second active region 12. Because second gate oxide layer 15 is formed by oxidizing twice, the thickness of second gate oxide layer 15 is larger than that of first gate oxide layer 14, as FIG. 1C illustrates. Referring to FIG. 1D, gate electrodes 16 are defined by the steps, sequentially, of depositing a polysilicon layer, patterning and etching the polysilicon layer. Impurities are implanted into silicon substrate 1 to form source/drain regions 17 using gate electrodes 16 as masking. MOS devices having gate oxide layers of different thicknesses are thereby attained.

However, in the conventional method, it is necessary that photoresist layer 100 be removed prior to the oxidation process for growing first gate oxide layer 14 and second oxide layer 15. As a result, during the removal process underlying oxide layer 13 is subject to contamination. For example, the method employed in removing the photoresist layer makes use of a chemical solution and even more oxygen plasma for eradicating it exactly. During this aspect of the process, the oxygen plasma can pollute oxide layer 13. This can result in a deterioration in oxide layer dielectric characteristics and reliability when oxide layer 13 is later incorporated into second gate oxide layer 15. Furthermore, it is difficult to control the oxidation speed of gate oxide layer 15 as it merges together with oxide layer 13. This indirectly affects the accuracy of gate oxide thickness.

SUMMARY OF THE INVENTION

It is therefore an object of the present invention to provide a method for fabricating gate oxide layers of different thicknesses without having the gate oxide layers suffer from oxygen plasma contamination when the photoresist layer is removed.

It is another object of the present invention to provide a method for fabricating gate oxide layers of different thicknesses whereby the thickness of each gate oxide layer can be accurately controlled.

To accomplish the objects of the invention, a method for fabricating gate oxide layers of different thicknesses is provided which includes the following steps. First, a field oxide layer is formed on a predetermined portion of a silicon substrate to define a plurality of first active regions and second active regions. Secondly, a first gate oxide layer is formed over the first active regions and the second active region. Next, a barrier layer is formed to cover a portion of the first gate oxide layer within the first active regions. The portion of the first gate oxide layer within the second active regions is then removed utilizing the barrier layer as masking. Finally, a second gate oxide layer is formed over the second active region.

Other objects, features and advantages of the invention will become more apparent by way of the following detailed description of the preferred, but non-limiting embodiments

BRIEF DESCRIPTION OF THE DRAWINGS

The accompanying drawings form a material part of this description whereby.

DETAILED DESCRIPTION OF THE PREFERRED EMBODIMENTS

Embodiment 1

Referring to FIGS. 2A–2D, the process flow of one preferred embodiment of the present invention is shown in cross-sectional views. For clarity, the drawings depict just two active regions having two gate oxide layers of different thicknesses, respectively.

Figure 1A:
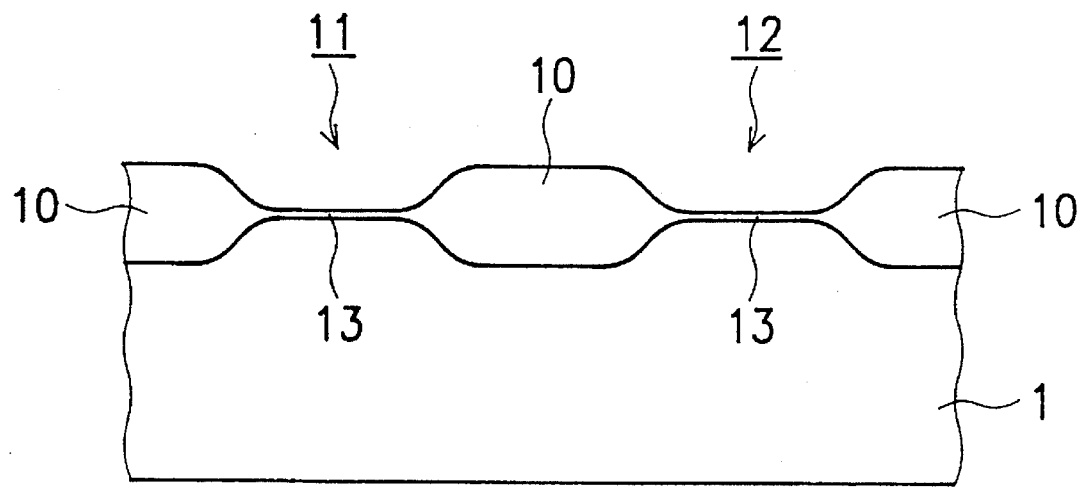
FIGS. 1A–1D schematically illustrate, in cross-sectional views, the steps of the process flow of the conventional method.
Figure 1B:
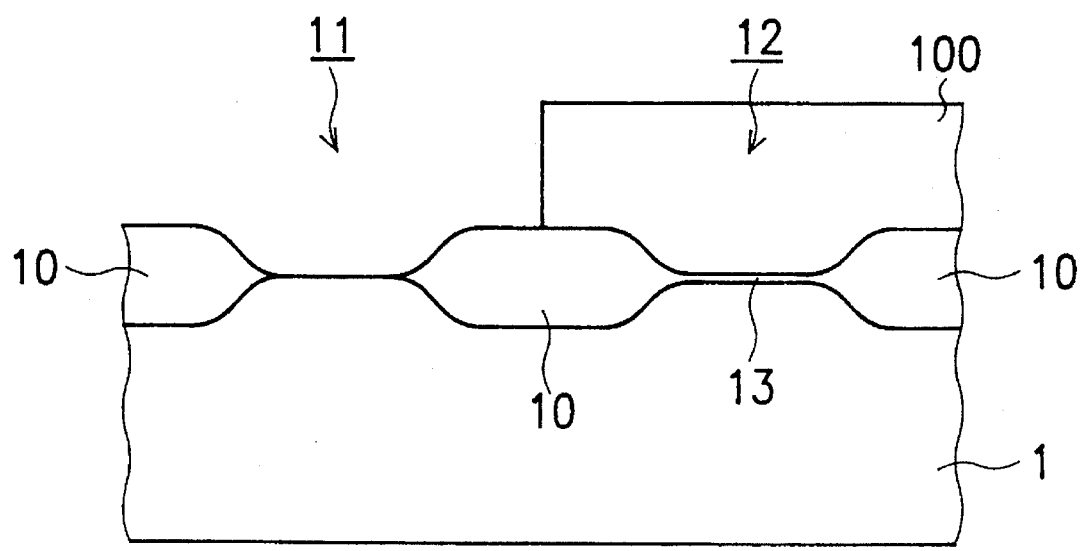
Figure 1C:
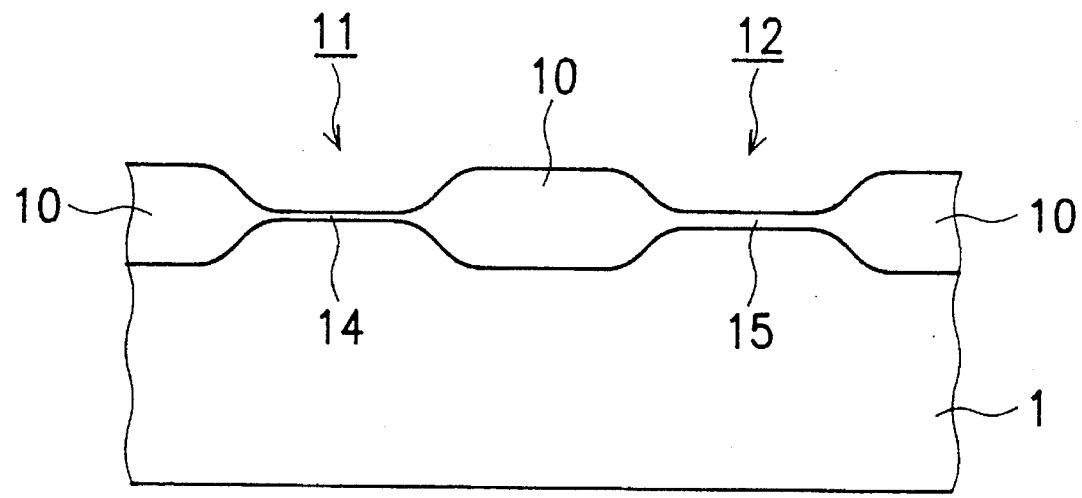
Figure 1D:
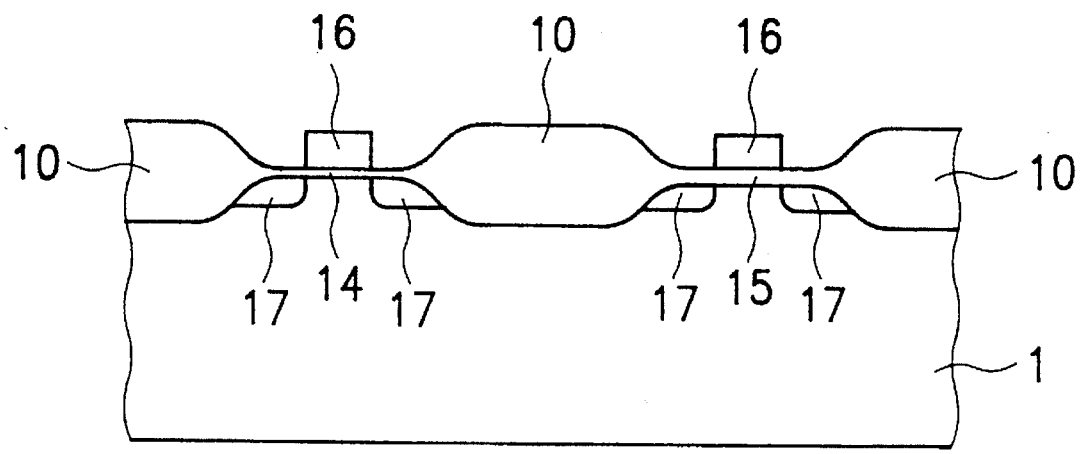
Figure 2A:
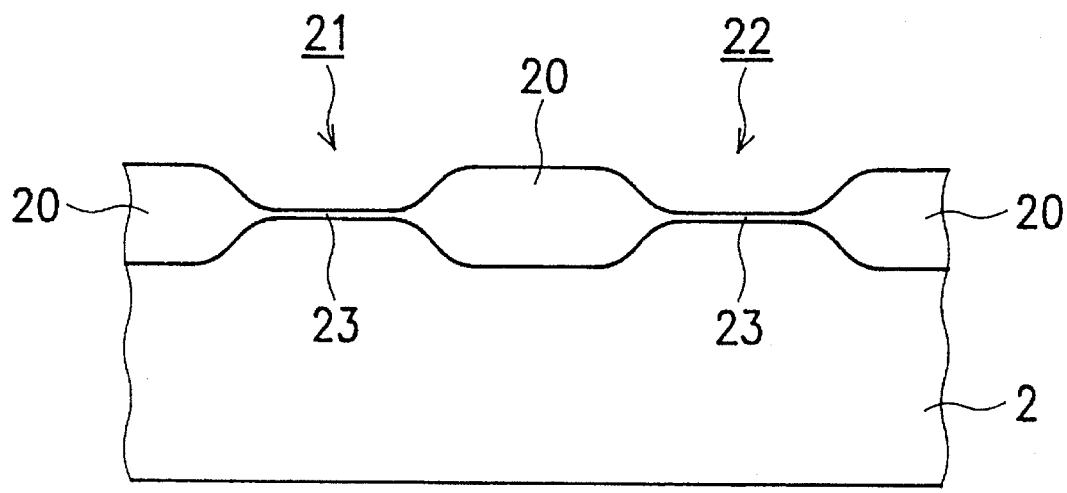
FIGS. 2A–2D schematically illustrate, in cross-sectional views, the steps of the process flow of one preferred embodiment of the invention.

First referring to FIG. 2A, field oxide layer 20 is formed (e.g., by the conventional LOCOS method) on a predetermined region of monocrystalline silicon substrate 2 to define first active region 21 and second active region 22. Simultaneously, first active region 21 and second active region 22 are subjected to a oxidation process at a temperature of 900° C. for 1.5 hours to grow a 300 Å sacrificial layer (not shown) in a dry oxygen ambiance. Impurities are then implanted into silicon substrate 2 to adjust the threshold voltage of the MOS devices to be formed thereon. If the employed impurity is $BF_2^+$, the implantation utilizes a dosage of 3.5E12 atoms/$cm^2$ at an energy level of 60 KeV. The sacrificial layer is then removed for subsequent processing. The formation of the sacrificial layer is used to prevent the substrate surface from implantation damage and is optional. Then, first active region 21 and second active region 22 are subjected to thermal oxidation at a temperature within the range of 750°–1000° C. for 10 minutes to 2 hours in a wet or dry oxygen ambiance (the preferable condition is 850° C. for 1 hour in dry $O_2$ to grow a 90 Å oxide layer) to grow first gate oxide layer 23.

Figure 2B:
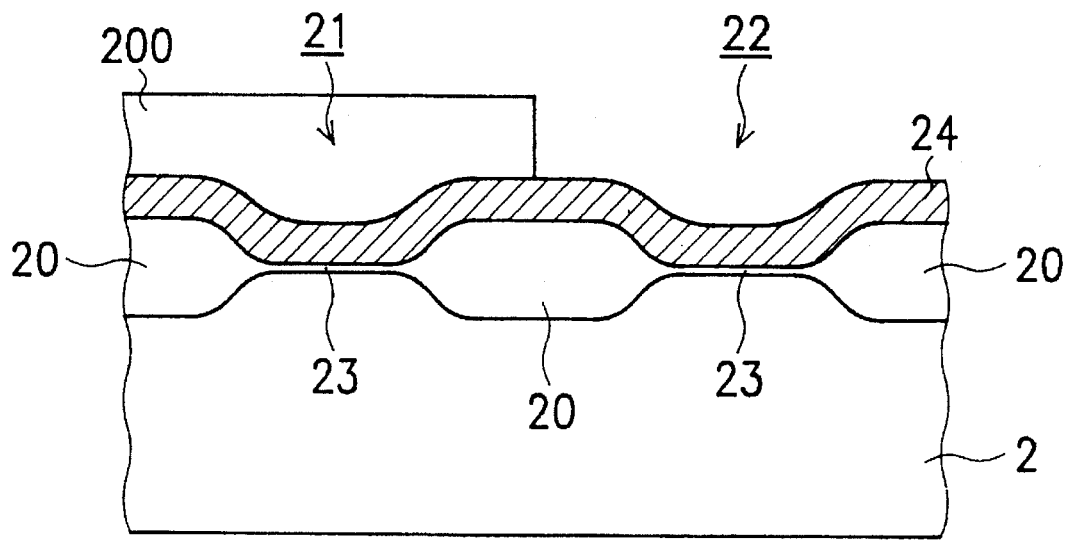

Next, as shown in FIG. 2B, silicon nitride layer 24 is formed on the overall surface by chemical vapor deposition to a thickness within range of 100–1000 Å. Utilizing the photolithography technique, photoresist layer 200 is formed on a portion of silicon nitride layer 24 to shield first active region 21.

Figure 2C:
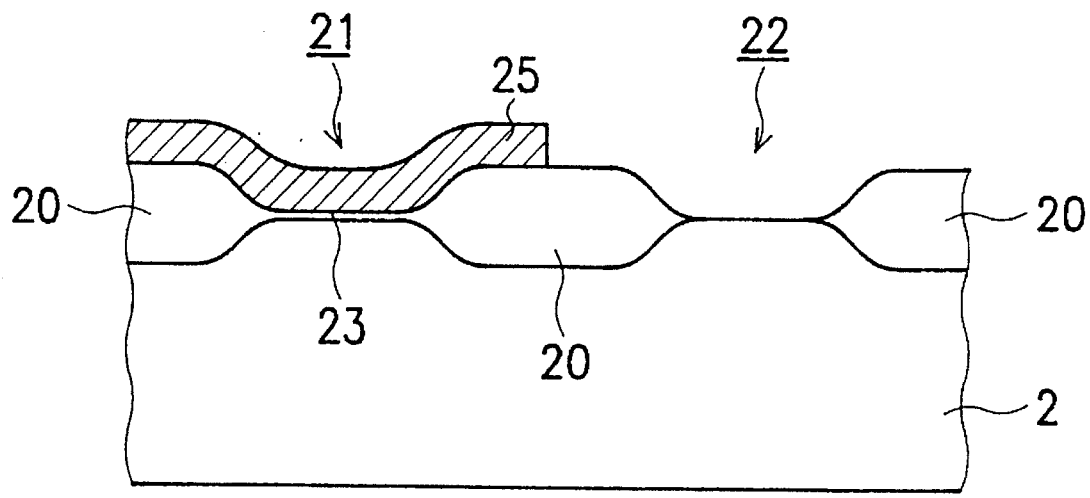

As depicted in FIG. 2C, silicon nitride layer 24 is etched using reactive ion etching (RIE), which possesses a high etching selectivity ratio of silicon nitride to silicon oxide. The portion shielding first active region 21 remains as barrier layer 25. After applying a chemical solution or plasma to remove photoresist layer 200, diluted hydrofluoric acid is employed to remove first gate oxide layer 23 within second active region 22 to expose substrate 2, using barrier layer 25 as a mask.

Figure 2D:
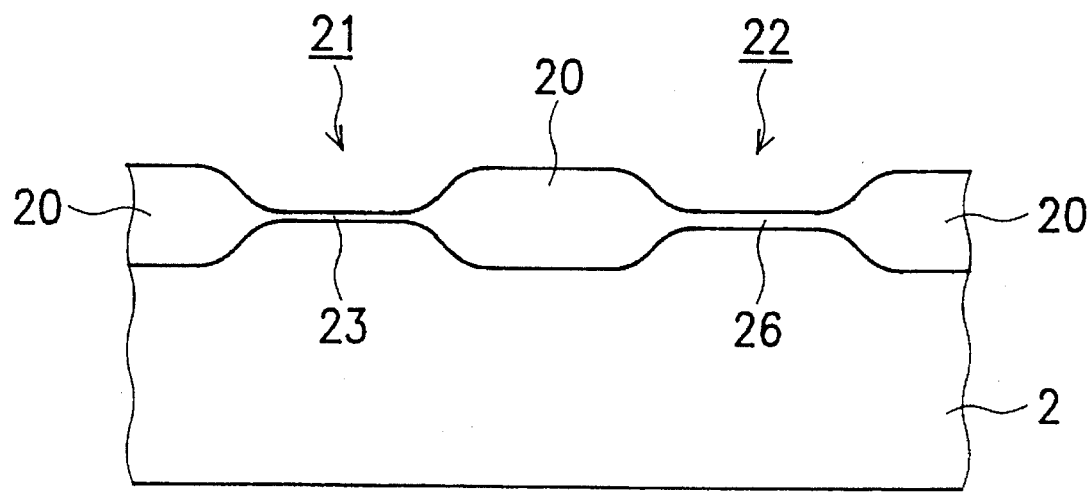

Ultimately, with barrier layer 25 as masking, the substrate of second active region 22 is subjected to thermal oxidation in order to grow second gate oxide layer 26 over second active region 22 at a temperature range within 750°–1000° C. for 10 minutes to 2 hours in a wet or dry oxygen ambiance (preferably, at 850° C. for 2 hours in dry $O_2$). Then, barrier layer 25 is removed by hot phosphoric acid (85% 180_C) resulting in a configuration as illustrated in FIG. 2D. If any oxide remains on the top of barrier layer 25, it is removed by a mixture of $HCl:H_2O_2:H_2O=1:1:5$ prior to removal of barrier layer 25. Subsequent processing for forming gate electrodes and source/drain regions are identical to the conventional method.

Embodiment 2

Referring to FIGS. 3A–3D, the process flow of another preferred embodiment according to the present invention is shown in cross-sectional view. For clarity, as above, the drawings illustrate two active regions having gate oxide layers with different thicknesses.

Figure 3A:
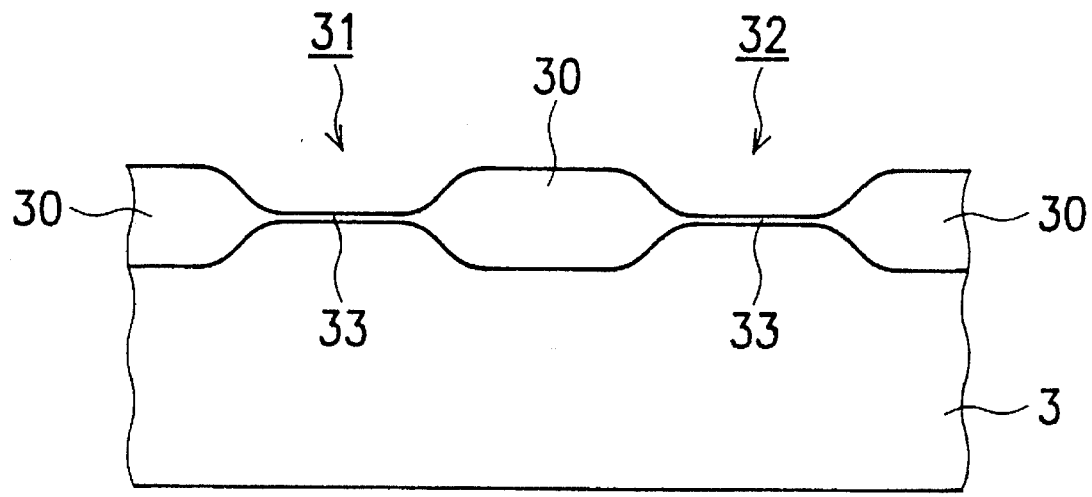
FIGS. 3A–3D schematically illustrate, in cross-sectional views, the steps of the process flow of another preferred embodiment of the invention.

First referring to FIG. 3A, field oxide layer 30 is formed (e.g., by the conventional LOCOS method) on a predetermined region of monocrystalline silicon substrate 3 to define first active region 31 and second active region 32. Simultaneously, first active region 31 and second active region 32 are subjected to a oxidation process at temperature 900° C. for 1.5 hours to grow a 300 Å sacrificial oxide layer (not shown) in a dry oxygen ambiance. Impurities are then implanted into silicon substrate 3 to adjust the threshold voltage of MOS devices to be formed thereon. If the employed impurity is $BF_2^+$, the implantation utilizes a dosage of 3.5E12 atoms/$cm^2$ at an energy level of 60 KeV. After that, the sacrificial oxide layer is removed for subsequent processing. The existence of the sacrificial oxide layer protects the substrate surface from implantation damage and is optional. Then, first active region 31 and second active region 32 are subjected to oxidation at a temperature within the range of 750°–1000° C. for 10 minutes to 2 hours in a wet or dry oxygen ambiance (the preferable condition is 850° C. for 1 hour to grow a 90 Å oxide layer in dry $O_2$) to grow first gate oxide layer 33.

Figure 3B:
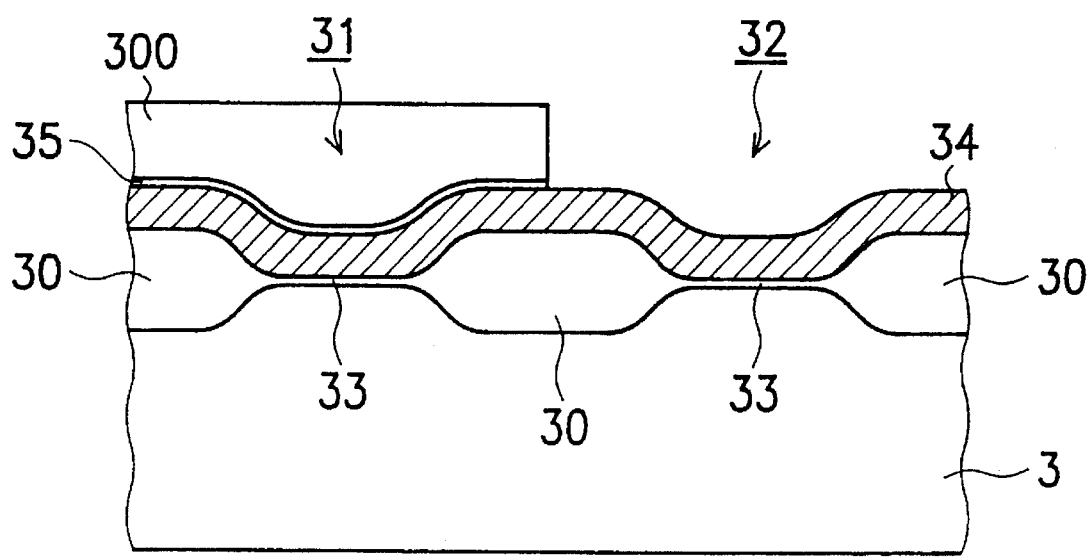

Next, silicon nitride layer 34 and silicon oxide layer 35 are sequentially formed to overlay the overall surface by chemical vapor deposition, wherein the thickness of silicon nitride layer 34 ranges from 100 to 1000 Å and silicon oxide layer 35 has a thickness within the range of 50–300 Å. By utilizing the photolithography technique, photoresist layer 300 is formed on a portion of silicon oxide layer 35 to shield first active region 31. Diluted hydrofluoric acid is then used to etch the portion of oxide layer 35 within second active region 32, employing photoresist layer 300 as masking. FIG. 3B depicts the resulting configuration.

Figure 3C:
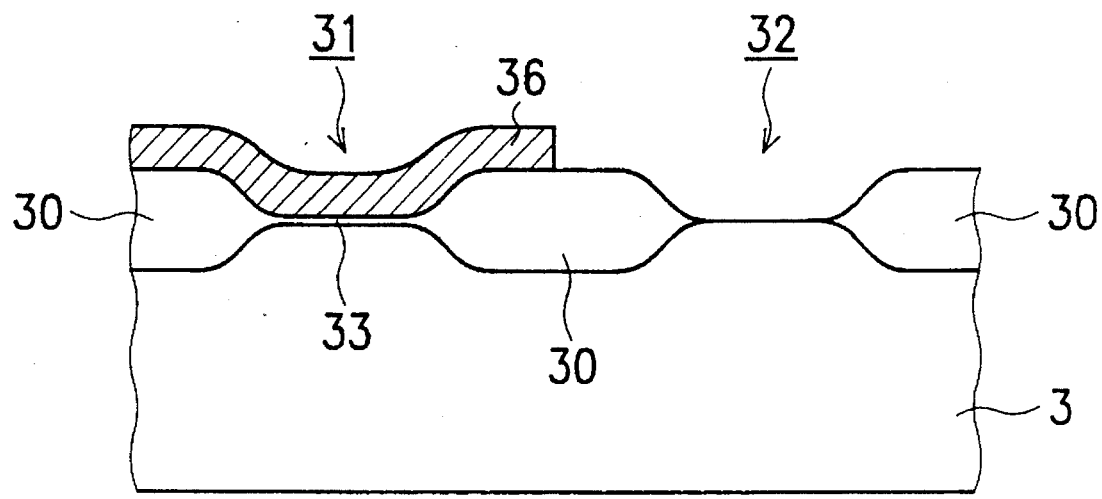
Figure 3D:
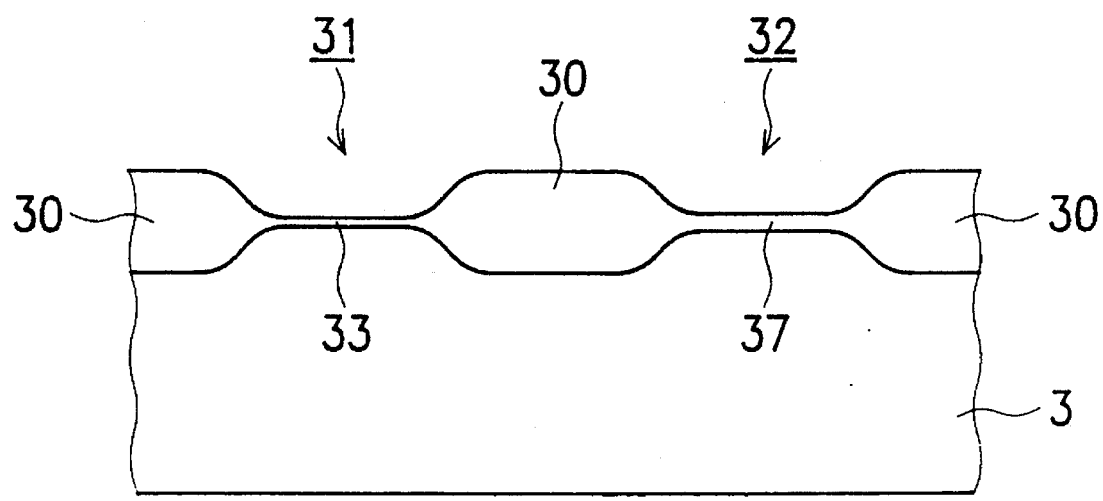

Referring now to FIG. 3C, photoresist layer 300 is removed by chemical solution, preferably sulfuric acid, or plasma etching. With the oxide layer as a hard mask, hot phosphoric acid is employed to etch the silicon nitride layer and the portion within first active region 31 remains as barrier layer 36. Afterwards, diluted hydrofluoric acid is employed to etch, the portion of first gate oxide layer 33 within second active region 32 to expose substrate 3, using barrier layer 36 as masking.

Finally, again utilizing barrier layer 36 as masking, the substrate of second active region 32 is subjected to thermal oxidation to grow second gate oxide layer 37 over second active region 32 at a temperature within the range of 750°–1000° C. for 10 minutes to 2 hours in a wet or dry oxygen ambiance (preferably, at 850° C. for 2 hours in dry $O_2$). Then, barrier layer 36 is removed by hot phosphoric acid (85%, 180_C), resulting in the configuration illustrated in FIG. 3D. If any oxide remains formed over barrier layer 36, it is removed by the mixture of $HCl:H_2O_2:H_2O=1:1:5$ prior to removing barrier layer 36. The subsequent process for forming gate electrodes and source/drain regions is the same as the conventional method.

In comparison with embodiments 1 and 2, it is noted that the silicon nitride layers 24 and 34 are etched by using RIE (dry) and phosphoric acid (wet), respectively. Because wet etching is iostropic, depositing a oxide layer 35 thereon serving as a hard mask will be helpful while the photoresist layer 300 lifts-off eventuality.

With respect to the present invention, the method described provides for fabricating gate oxide layers of different thicknesses. Owing to the existence of a barrier layer, the contamination of an underlying gate oxide layer induced by the etching of a photoresist layer can be averted. The thickness of the gate oxide layers can be grown accurately and independently.

While the invention has been particularly shown and described with reference to the preferred embodiments thereof, it will be understood by those skilled in the art that various changes in form and details may be made without departing from the spirit and scope of the invention.

What is claimed is:

1. A method for fabricating gate oxide layers of different thicknesses on a silicon substrate comprising the steps of:
   (a) forming a field oxide layer on said substrate to define a plurality of first active regions and second active regions therebetween;
   (b) forming a first gate oxide layer over said plurality of first active regions and said second active regions;
   (c) forming a silicon nitride layer onto an overall surface;
   (d) patterning and etching said silicon nitride layer to remove a portion of said silicon nitride layer within said second active regions;
   (e) removing a portion of said first gate oxide layer within said second active regions; and
   (f) forming a second gate oxide layer over said second active regions.

2. The method of claim 1, wherein said silicon nitride layer has a thickness ranging between 100 Å to 1000 Å.

3. The method of claim 1, wherein the step (d) is performed by reactive ion etching.

4. The method of claim 1, wherein the step of forming said first gate oxide layer and the step of forming said second gate oxide layer each include the step of performing dry oxidation at a temperature range of 750° C. to 1000° C. for 10 minutes to 2 hours.

5. The method of claim 1, wherein the step of forming said first gate oxide layer and the step of forming said second gate oxide layer each include the step of performing wet oxidation at a temperature range of 750° C. to 1000° C. for 10 minutes to 2 hours.

6. The method of claim 1, further comprising, between step (a) and (b), the step of performing an implantation process for adjusting the threshold voltage.

7. The method of claim 1, wherein the step (e) is performed by hydrofluoric acid.

8. A method for fabricating gate oxide layers of different thicknesses on a silicon substrate comprising the steps of:
   (a) forming a field oxide layer on said substrate to define a plurality of first active regions and second active regions therebetween;
   (b) forming a first gate oxide layer over said plurality of first active regions and said second active regions;
   (c) forming a silicon nitride layer onto an overall surface;
   (d) forming a silicon oxide layer over said silicon nitride layer;
   (e) removing a portion of said silicon oxide layer within said second active regions;
   (f) etching said silicon nitride layer to remove a portion of said silicon nitride layer within said second active regions;
   (g) removing said silicon oxide layer;
   (h) removing a portion of said first gate oxide layer within said second active regions; and
   (i) forming a second gate oxide layer over said second active regions.

9. The method of claim 8, wherein said silicon oxide layer has a thickness ranging between 50 Å and 1000 Å.

10. The method of claim 8, wherein said silicon nitride layer has a thickness ranging between 100 Å to 1000 Å.

11. The method of claim 8, wherein the step (f) is performed by phosphoric acid.

12. The method of claim 8, wherein the step of forming said first gate oxide layer and the step of forming said second gate oxide layer each include the step of performing dry oxidation at a temperature range of 750° C. to 1000° C. for 10 minutes to 2 hours.

13. The method of claim 8, wherein the step of forming said first gate oxide layer and the step of forming said second gate oxide layer each include the step of performing wet oxidation at a temperature range of 750° C. to 1000° C. for 10 minutes to 2 hours.

14. The method of claim 8, further comprising between step (a) and (b), the step of performing an implantation process for adjusting the threshold voltage.

15. The method of claim 8, wherein step (h) is performed by hydrofluoric acid.

* * * * *